United States Patent [19]
Yoshino et al.

[11] 3,902,121
[45] Aug. 26, 1975

[54] AUTOMATIC TUNER

[75] Inventors: Hirokazu Yoshino, Katano; Tetsuo Yamaguchi, Hirakata; Eiichi Tsuboka, Nara, all of Japan

[73] Assignee: Matsushita Electric Industrial Co., Ltd., Kadoma, Japan

[22] Filed: Dec. 5, 1972

[21] Appl. No.: 312,326

[30] Foreign Application Priority Data

Dec. 8, 1971 Japan .......... 46-99746
Nov. 17, 1972 Japan .......... 47-11586

[52] U.S. Cl. .......... 325/335; 325/420; 325/468
[51] Int. Cl. .......... H04b 1/36
[58] Field of Search .......... 325/416–423, 325/452–453, 468, 469, 470, 464, 25, 334, 335; 334/17

[56] References Cited

UNITED STATES PATENTS

| | | | |
|---|---|---|---|
| 3,560,858 | 2/1971 | Sakai et al. | 325/470 |
| 3,611,152 | 10/1971 | Sakai | 325/469 |
| 3,641,434 | 2/1972 | Yates et al. | 325/25 |
| 3,675,132 | 7/1972 | Hansen | 325/469 |
| 3,725,788 | 4/1973 | Fathauer | 325/469 |

*Primary Examiner*—Benedict V. Safourek
*Assistant Examiner*—Jin F. Ng
*Attorney, Agent, or Firm*—Stevens, Davis, Miller & Mosher

[57] ABSTRACT

An automatic tuner for television receivers in which the oscillation frequency of a first voltage controlled oscillator in a phase locked loop is brought to a predetermined frequency corresponding to given channel selection information, and the oscillation frequency of a second voltage controlled oscillator is swept until the beat frequency obtained from the first and second voltage controlled oscillators reaches a particular frequency. After the reaching of the practicular frequency, the second voltage controlled oscillator is locked to its oscillation frequency at the instant of reaching the particular frequency, and its output is used as a local oscillator signal.

11 Claims, 14 Drawing Figures

PATENTED AUG 26 1975 3,902,121

SHEET 3

FIG. 11

| | CHANNEL NO | CARRIER FREQUENCY (MHz) | LOCAL OSCILLATOR FREQUENCY (MHz) | VCO 11 OSCILLATION FREQUENCY $f_{11}$ (MHz) | VCO 15 OSCILLATION FREQUENCY $f_{15}$ (MHz) | 1/200 (MHz) | FREQUENCY DIVISION RATIO P OF VARIABLE FREQUENCY DIVIDER 11 | REFERENCE FREQUENCY $f_0$ (KHz) |
|---|---|---|---|---|---|---|---|---|
| VHF | 1 | 91.25 | 150 | SAME AS LOCAL OSCILLATOR FREQUENCY | — | 0.75 | 150 | 5 |
| | 2 | 97.25 | 156 | | — | 0.78 | 156 | " |
| | 3 | 101.25 | 162 | " | — | 0.81 | 162 | " |
| | 4 | 171.25 | 230 | " | — | 1.15 | 230 | " |
| | 5 | 177.25 | 236 | " | — | 1.18 | 236 | " |
| | 6 | 183.25 | 242 | " | — | 1.21 | 242 | " |
| | 7 | 189.25 | 248 | " | — | 1.24 | 248 | " |
| | 8 | 193.25 | 252 | " | — | 1.26 | 252 | " |
| | 9 | 199.25 | 258 | " | — | 1.29 | 258 | " |
| | 10 | 205.25 | 264 | " | — | 1.32 | 264 | " |
| | 11 | 211.25 | 270 | " | — | 1.35 | 270 | " |
| | 12 | 217.25 | 276 | " | — | 1.38 | 276 | " |
| UHF | 13 | 471.25 | 530 | 157 | SAME AS LOCAL OSCILLATOR FREQUENCY | 0.785 | 157 | " |
| | 14 | 477.25 | 536 | 159 | | 0.795 | 159 | " |
| | 34 | 597.25 | 656 | 199 | " | 0.995 | 199 | " |
| | 61 | 759.25 | 818 | 253 | " | 1.265 | 253 | " |
| | 62 | 765.25 | 824 | 255 | " | 1.275 | 255 | " |

VCO: VOLTAGE CONTROLLED OSCILLATOR $f_{11} = 200\,P\,f_0 \times 10^{-3}$ (MHz) $f_{15} = f_{11} + 59$ (MHz)

F I G . 12

| | CHAN-NEL NO | CARRIER FREQUENCY (MHz) | LOCAL OSCILLATOR FREQUENCY (MHz) | VCO 75 OSCILLATION FREQUENCY $f_{75}$(MHz) | VCO 71 OSCILLATION FREQUENCY $f_{71}$(MHz) | VCO 82 OSCILLATION FREQUENCY $f_{82}$(MHz) | 1/200 (MHz) | FREQUENCY DIVISION RATIO P OF VARIABLE FREQUENCY DIVIDER 65 | REFERENCE FREQUENCY fo(KHz) |
|---|---|---|---|---|---|---|---|---|---|
| VHF | 1 | 91.25 | 150 | SAME AS LOCAL OSCILLATOR FREQUENCY | — | — | 0.75 | 150 | 5 |
| | 2 | 97.25 | 156 | | — | — | 0.78 | 156 | " |
| | 3 | 101.25 | 162 | " | — | — | 1.81 | 162 | " |
| | 4 | 171.25 | 230 | " | — | — | 1.15 | 230 | " |
| | 5 | 177.25 | 236 | " | — | — | 1.18 | 236 | " |
| | 6 | 183.25 | 242 | " | — | — | 1.21 | 242 | " |
| | 7 | 189.25 | 248 | " | — | — | 1.24 | 248 | " |
| | 8 | 193.25 | 252 | " | — | — | 1.26 | 252 | " |
| | 9 | 199.25 | 258 | " | — | — | 1.29 | 258 | " |
| | 10 | 205.25 | 264 | " | — | — | 1.32 | 264 | " |
| | 11 | 211.25 | 270 | " | — | — | 1.35 | 270 | " |
| | 12 | 217.25 | 276 | " | — | — | 1.38 | 276 | " |
| UHF | 13 | 471.25 | 530 | — | 157 | SAME AS LOCAL OSCILLATOR FREQUENCY | 0.785 | 157 | " |
| | 14 | 477.25 | 536 | — | 159 | | 0.795 | 159 | " |
| | ⋮ | ⋮ | ⋮ | ⋮ | ⋮ | ⋮ | ⋮ | ⋮ | " |
| | 34 | 597.25 | 656 | — | 199 | " | 0.995 | 199 | " |
| | ⋮ | ⋮ | ⋮ | ⋮ | ⋮ | ⋮ | ⋮ | ⋮ | " |
| | 61 | 759.25 | 818 | — | 253 | " | 1.265 | 253 | " |
| | 62 | 765.25 | 824 | — | 255 | " | 1.275 | 255 | " |

VCO: VOLTAGE CONTROLLED OSCILLATOR $f_{11} = 200\ P\ fo \times 10^{-3}$ (MHz) $f_{82} = 3 f_{71} + 59$ (MHz)

AUTOMATIC TUNER

This invention relates to automatic tuners for television receivers.

With the recent increase of the number of television channels, there has arisen the necessity of automating the operation of the tuner in television receivers. Particularly, this demand has been escalated up to date with the increase in the number of UHF channels.

The prior-art automatic tuners include those, wherein the capacitance of a variable capacitor in the tuner circuit is varied by means of a motor until an intermediate frequency output appears, or those, wherein a sawtooth voltage impressed on a variable capacitance diode in the tuner circuit is swept until the appearance of an intermediate frequency output.

With these tuners, the frequency sweeping is stopped when a desired channel is tuned in. Therefore, each time a selected station is tuned in the other stations should be de-tuned, and this would necessitate quite involved operations.

To overcome this drawback, it has been proposed to generate a code specifying a desired channel from a keyboard or the like and impress a d-c voltage corresponding to the code upon a variable capacitance diode in the tuner circuit for tuning in the desired channel. This method, however, has drawbacks in that it is extremely difficult to ensure correct one-to-one correspondence between code and d-c voltage. In the circuit construction designed to carry out this method, it is very troublesome to compensate for fluctuations in various circuit constants, and also it is difficult to compensate for their changes with temperature or in use for long time.

The present invention has been intended to overcome these drawbacks, and it has an object of providing an automatic tuner capable of reliably effecting automatic tuning in UHF as well as VHF channels.

Another object of the invention is to provide an automatic tuner, which can use a keyboard or the like for the channel information feeding means, and whose channel information input means may be of a simple construction.

A further object of the invention is to provide an automatic tuner, which has a tuning function suited to receive UHF channels and also a tuning function suited to receive VHF channels.

In order for the invention to be more fully understood, it will now be described in conjunction with some preferred embodiments with reference to the accompanying drawings, in which:

FIGS. 11 and 12 show tables listing various frequencies and frequency division ratios for the respective embodiments of FIGS. 1 and 10.

Figure 1:
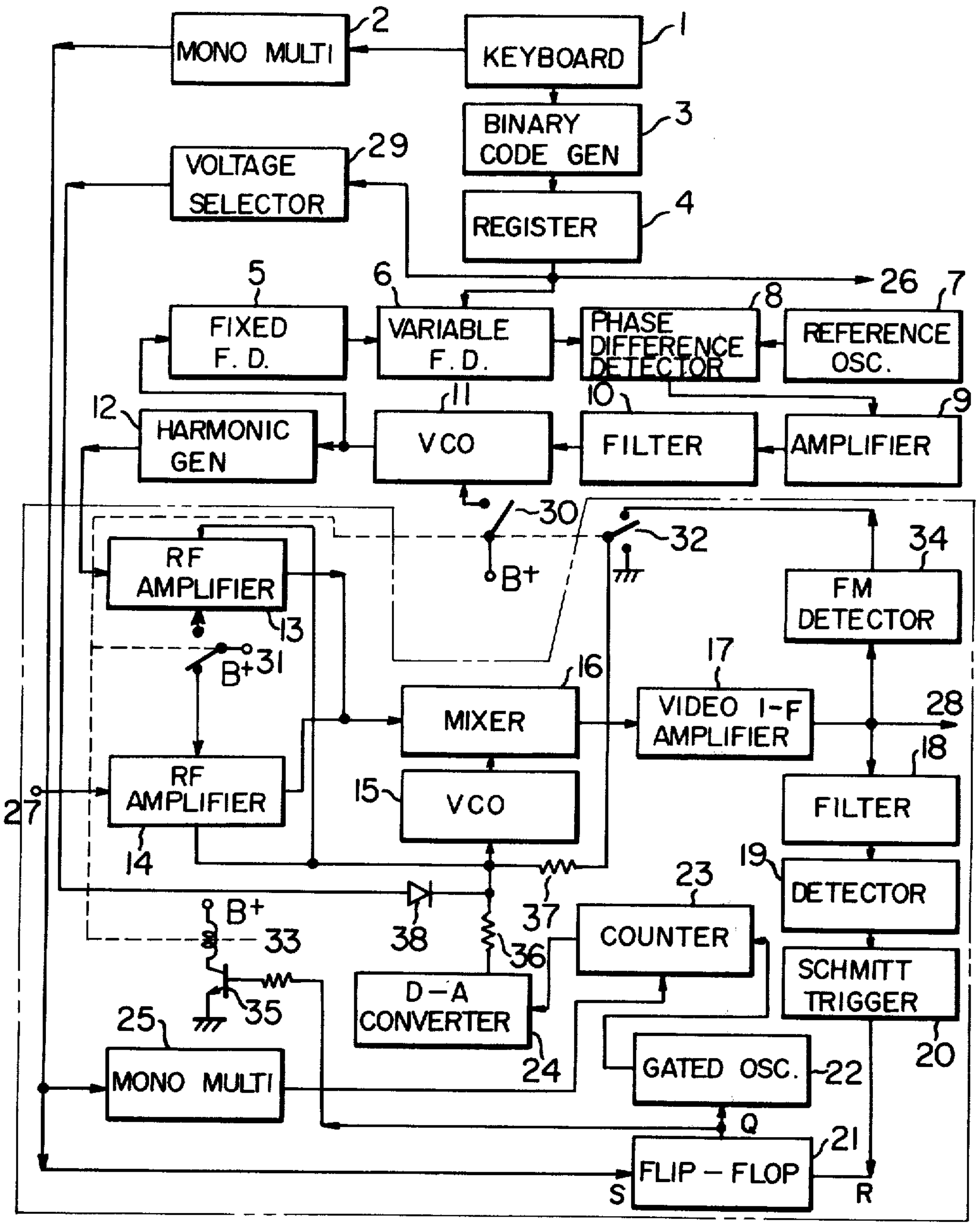
FIG. 1 is a block diagram showing an embodiment of the automatic tuner according to the invention.
Figure 4:
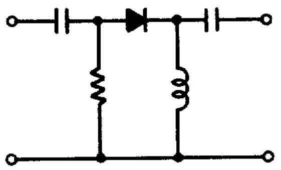
FIG. 4 is a connection diagram showing a harmonic generator.
Figure 5:
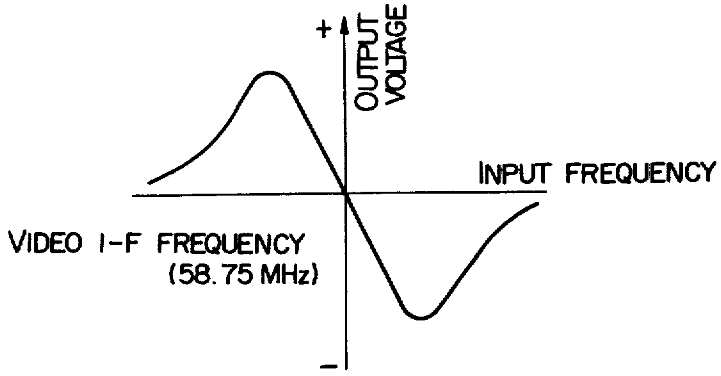
FIG. 5 is a characteristic of a FM detector or frequency discriminator.

Referring to FIG. 1, an embodiment of the invention applied to a television receiver is shown. Reference numeral 1 designates a keyboard for selecting desired stations to be tuned in. Numeral 2 designates a monostable multivibrator to produce a pulse each time a channel number corresponding to a desired station is keyed in the keyboard 1. Numeral 3 designates a binary code generator to convert the channel information from the keyboard 1 into a corresponding binary code, and numeral 4 a register to memorize the output of the binary code generator 3 and constructed with flip-flops or the like. Numeral 5 designates a fixed frequency divider to divide the input signal frequency by a fixed division factor, numeral 6 a variable frequency divider to divide the frequency of the output of the fixed frequency divider 5 to a ratio corresponding to the code output of the memory 4, numeral 7 a reference frequency oscillator consisting of a crystal oscillator or the like, numeral 8 a phase difference detector to compare the phase and frequency of the output of the variable frequency divider 6 and the output of the reference frequency oscillator 7, numeral 9 an amplifier to amplify the output of the phase difference detector 8, numeral 10 a loop filter to smooth the output of the amplifier 9, and numeral 11 a voltage controlled oscillator oscillating at a frequency corresponding to d-c output voltage of the loop filter 10. Numeral 12 designates a harmonic generator to produce a harmonic of the output frequency of the control voltage oscillator 11. For example, a circuit as shown in FIG. 4 may be used for the harmonic generator 12. Numerals 13 and 14 designate r-f amplifiers including variable capacitance diodes as the tuning element. Numeral 15 designates a second voltage controlled oscillator oscillating at a frequency corresponding to the input voltage. Numeral 16 designates a mixer to combine the output of the r-f amplifier 13 or 14 and the output of the voltage controlled oscillator 15, and numeral 17 a video i-f amplifier. Numeral 18 designates a filter constructed with a crystal element or the like and having an extremely narrow pass band, numeral 19 a detector to rectify the filter output and derive the envelope thereof, numeral 20 a Schmitt trigger shaper consisting of a Schmitt trigger circuit and an inverter for converting the output of the detector 19 into a corresponding square wave of a constant amplitude, numeral 21 a flip-flop, numeral 22 a gated oscillator, numeral 23 a counter, numeral 24 a digital-to-analog converter, and numeral 25 a monostable multivibrator. Numeral 26 designates a terminal connected to an indicator (not shown) used to indicate the channel number or like channel information corresponding to the output code of the memory 4, numeral 27 a terminal connected to an antenna input circuit (not shown), and numeral 28 a video i-f output terminal. Numeral 29 designates a voltage selector to select a voltage corresponding to the output code of the memory 4. Numerals 30 to 32 designate contacts of a relay and operated by a relay coil 33. Numeral 34 designates an FM detector which has an output voltage versus input frequency characteristic as shown in FIG. 5.

The operation of the embodiment of the above circuit construction will now be described under the assumption that the oscillation frequency $f_0$ of the reference oscillator 7 is set to 5 kHz and the division factor of the fixed frequency divider 5 to 200. When a channel number corresponding to a desired station is keyed in the keyboard 1, the binary code generator 3 produces a corresponding binary code, which is memorized in the memory 4. The frequency division ratio of the variable frequency divider 6 is determined by the code memorized in the memory 4. The variable frequency divider 6 may be constructed with commercially available integrated circuits. The elements 5 to 11 constitute a so-called phase locked loop, and the output signal of the voltage controlled oscillator 11 is frequency divided through the frequency dividers 5 and 6. The output of the variable frequency divider 6 is phase and frequency compared with the output of the reference frequency oscillator 7 in the phase difference detector 8. The phase difference detector 8 is constructed with a flip-flop, which is adapted to receive a reset signal derived through differentiation of the output of the variable frequency divider 6 at its reset terminal (R) and a set signal derived through differentiation of the output of the reference frequency oscillator 7 at its set terminal (S), so that the Q outputs of the flip-flop is a train of rectangular pulses with various pulse widths corresponding to the phase difference of frequency difference between the output of the variable frequency divider 6 and the output of the reference frequency oscillator 7. The Q output is sufficiently amplified through the pulse amplifier 9, whose output is then smoothed through the loop filter 10 to obtain an oscillation frequency control voltage coupled to the voltage controlled oscillator 11. If the frequency of resetting of the phase difference detector 8 exceeds the setting frequency thereof due to increase in the output frequency of the voltage controlled oscillator 11, the output of the phase difference detector 8 assumes low potential state in a greater proportion, whereby the frequency control voltage added to the voltage controlled oscillator 11 is reduced to reduce the oscillation frequency thereof. On the other hand, if the frequency of resetting of the phase difference detector 8 becomes smaller than the setting frequency thereof due to decrease in the output frequency of the voltage controlled oscillator 11, the output of the phase difference detector 8 assumes high potential state in a greater proportion, whereby the frequency control voltage coupled to the voltage controlled oscillator 11 is increased to increase the oscillation frequency thereof. By this negative feedback action, the oscillation frequency of the voltage controlled oscillator 11 is eventually locked to a certain predetermined frequency related to the frequency division ratios of the frequency dividers 5 and 6 and the oscillation frequency of the reference frequency oscillator 7. Since the frequency division ratio of the fixed frequency divider 5 and the oscillation frequency of the reference frequency oscillator 7 are constant, the oscillation frequency of the voltage controlled oscillator 11 can be suitably controlled by appropriately varying the frequency division ratio of the variable frequency divider 6. The response characteristic of this loop depends upon the form of the transfer function of the loop filter 10. The binary code generator 3 gives the variable frequency divider 6 such a frequency division ratio as to lock the voltage controlled oscillator 11 to a frequency corresponding to the desired channel to be tuned in.

The voltage controlled oscillator 11 may in itself be used as local oscillator for receiving desired stations. Various frequencies and the frequency division ratio of the variable frequency divider for tuning in the VHF television channels in this example are shown, in the VHF section in the table of FIG. 11. The fixed frequency divider 5 is provided because the upper limit of the input frequency range covered by the variable frequency divider 6 is not so high so that it is necessary to frequency divide the output of the voltage controlled oscillator 11 into a frequency within the aforementioned range. With this measure, however, the receivable frequency range which depends upon the input frequency coverage of the fixed frequency divider 5, is only as wide as the VHF band at most.

The case of receiving a UHF channel, for instance Channel No. 34, will now be described by having also reference to FIG. 2. When channel number 34 is keyed in the keyboard 1, the binary code generator 3 produces such a binary code as to set the frequency division ratio of the variable frequency divider 6 to 199. As a result, the voltage controlled oscillator 11 becomes locked to 199 MHz as mentioned earlier. Meanwhile, upon keying of the channel number in the keyboard 1 the monostable multivibrator 2 produces a pulse (shown at A in FIG. 2), with which the flip-flop 21 is set (as shown at D in FIG. 2). Concurrently, the multivibrator 25 is triggered and brought to a quasi-stable state (shown at B in FIG. 2). While the monostable multivibrator 25 is in the quasistable state, the counter 23 is held in the reset state so that the digital-to-analog converter 24 provides zero output. Upon setting of the flip-flop 21 the Q output thereof turns to a high potential state, so that the gated oscillator 22 starts oscillation (as shown at E in FIG. 2), while a transistor 35 is simultaneously triggered to activate the relay coil 33, thus connecting a power supply through the relay contact 30 to the voltage controlled oscillator 11 to render the phase locked loop operative and also throwing the relay contact 32 to the earth side and the relay contact 31 to the side of the r-f amplifier 13. Thus, the r-f amplifier 13 is rendered operative, while the r-f amplifier 14 is rendered inoperative.

Figure 2:
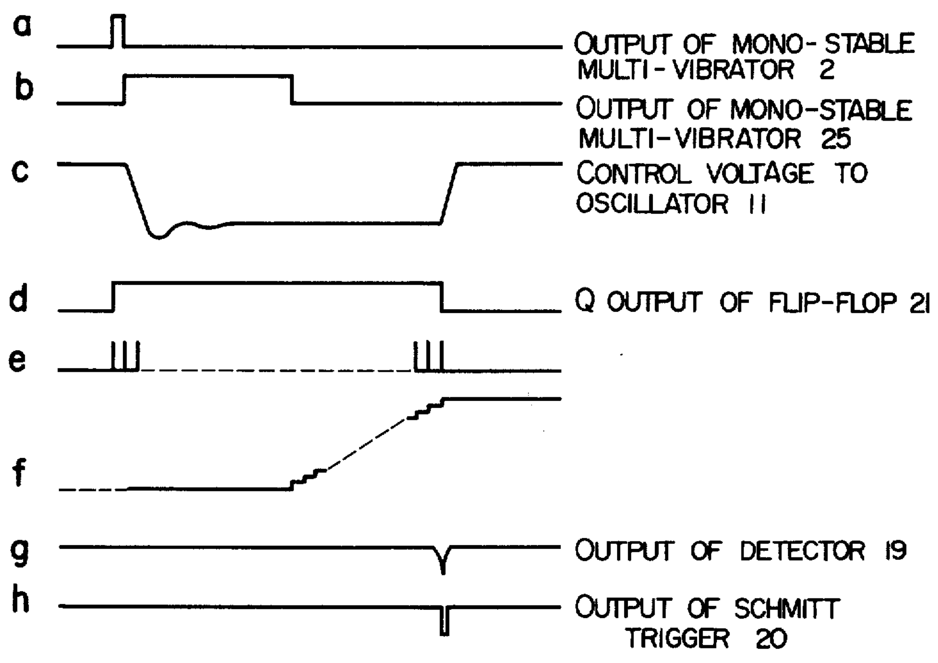
FIG. 2 is a waveform chart showing signal waveforms appearing at various parts of the embodiment of FIG. 1.

The frequency control voltage coupled to the voltage controlled oscillator 11 varies in a manner as shown at C in FIG. 2. It varies in accordance with the output frequency of the voltage controlled oscillator 11 and it settles to a certain constant value while monostable multivibrator 25 is still in the quasi-stable state; in the instant case it settles to 199 MHz.

When the monostable multivibrator 25 returns to its initial stable state, the counter 23 is freed from the reset state and starts to count the output of the gated oscillator 22, and the digital count is converted into analog quantity through the digital-to-analog converter 24, whose output voltage is coupled through a resistor 36 to the voltage controlled oscillator 15 as oscillation frequency control voltage and to r-f amplifiers 13 and 14 as tuning frequency control voltage. The r-f amplifiers 13 and 14 are of the type using variable capacitance diodes and employed in the commonly termed electronic tuners, and tracking is taken between their tuning frequency and the oscillation frequency of the voltage controlled oscillator 15, that is, the r-f amplifiers 13 and 14 are constructed such that their tuning frequency is always lower than the oscillation frequency of the voltage controlled oscillator 15 by the intermediate frequency 58.75 MHz. The output of the r-f amplifier 13 and the output of the voltage controlled oscillator 15 are combined in the mixer 16, whose output is amplified by the video i-f amplifier 17 to obtain video i-f signal available at the terminal 28.

The filter 18, which has a very narrow pass band, detects a 59 MHz output of the video i-f amplifier, and its output is rectified by the envelope detector 19 (as shown at G in FIG. 2) and shaped into a pulse (as shown at H in FIG. 2) by the shaper 20. In other words, when the difference frequency between the outputs of i-f amplifer 13 and voltage controlled oscillator 15 reaches 59 MHz, the shaper 20 produces an output pulse, whereupon the flip-flop 21 is reset. At this instant, the Q output of the flip-flop 21 falls back to the initial low potential state (as shown at D in FIG. 2), so that the oscillation of the gated oscillator 22 ceases (as shown at E in FIG. 2). As a consequence, the count of the counter 23, i.e., the output voltage of the digital-to-analog converter 24, at the instant of appearance of the pulse from the shaper 20 is subsequently held unchanged (as shown at F in FIG. 2). The ceasing of the oscillation of the gated oscillator 22 also brings an end to the frequency sweep in the voltage controlled oscillator 15, which then continues to oscillate at the frequency at this instant. Further, the transistor 35 is cut off at this instant to de-energyze the relay coil 33, thus cutting power supply to the voltage controlled oscillator 11 so that the oscillation frequency control voltage thereto changes in a manner as shown at C in FIG. 2. Simultaneously, the switch 31 switches power supply from r-f amplifier 13 to r-f amplifier 14, thus rendering the amplifier 13 inoperative while rendering the amplifier 14 operative. Further, the switch 32 is thrown back to the side of the FM detector 34, so that the output thereof is coupled through a resistor 37 to the voltage controlled oscillator 15 in superimposition upon the output of the digital-to-analog converter 24 to provide for the control of the oscillation frequency of the voltage controlled oscillator 15 such that the output of the video i-f amplifier is maintained at 58.75 MHz to ensure optimum tuning at all time.

The output voltage of the voltage selector 29 is coupled through a diode 38 to the voltage controlled oscillator 15 to determine the sweep initiation frequency thereof. By appropriately selecting the sweep initiation frequency, it is possible to detect the instant when the frequency difference between, for instance, the third harmonic of the output frequency of the voltage controlled oscillator 11 and the output frequency of the oscillator 15 is 59 MHz.

Figure 3:
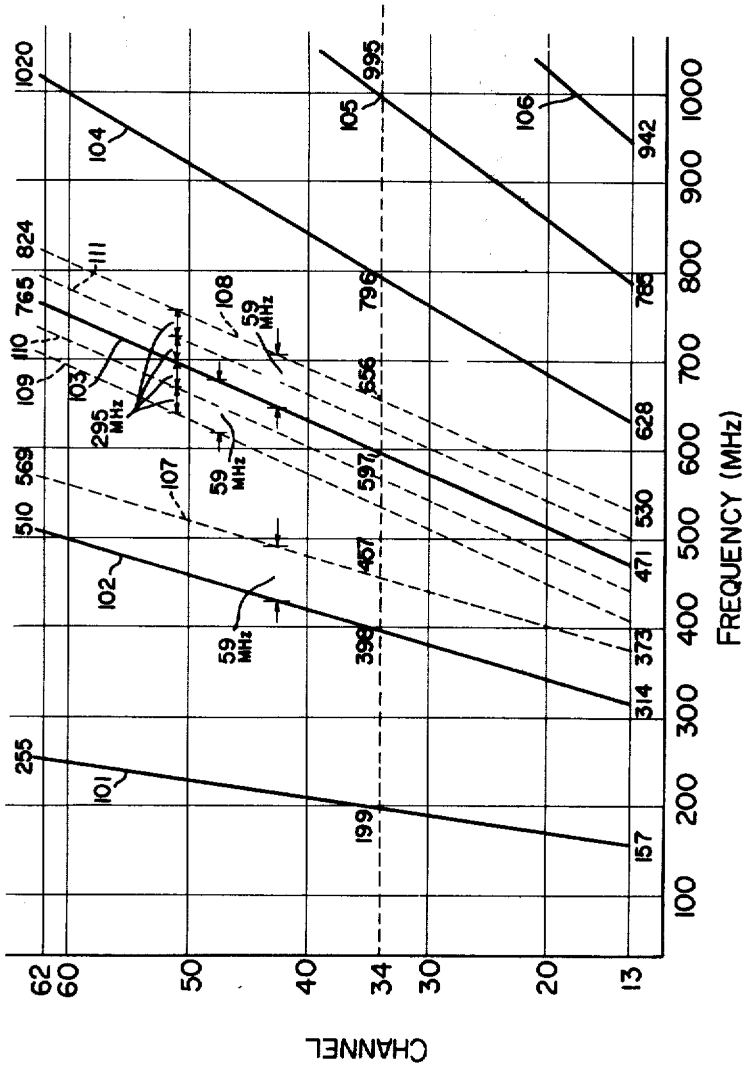
FIG. 3 is a graph showing working frequencies of some parts in the embodiment of FIG. 1.

In the graph of FIG. 3, labeled 101 is a plot of oscillation frequencies of the voltage controlled oscillator 11 for corresponding UHF channels, and labeled 102 to 106 are plots of respectively second to sixth harmonics of these frequencies. In the case of taking the beat frequency between the output of the oscillator 15 and the third harmonic of the output frequency of the oscillator 11, the sweep initiation frequency of the oscillator 15 need only be higher than a frequency in a dashed plot 107 for any UHF channel. Dashed plot 108 indicates local oscillation frequencies for corresponding channels. These local oscillation frequencies are higher than the third harmonic of the corresponding output frequencies of the voltage controlled oscillator 11 by 59 MHz. The frequency sweeping in the voltage controlled oscillator 15 comes to an end when a frequency in the plot 108 is reached. For Channel No. 34 the second harmonic of the locked oscillation frequency of the voltage controlled oscillator 11 is 398 MHz. In this case, by initiating the frequency sweeping in the voltage controlled oscillator 15 from 457 MHz higher than the afore-mentioned frequency by 59 MHz, the sweeping stops at a frequency of 656 MHz, which is higher than the third harmonic, in this case 597 MHz, of the oscillator 11 by 59 MHz and constitutes the local oscillation frequency. In this example, various frequencies and the frequency division ratio of the variable frequency divider for receiving UHF television channels are listed in the UHF section in the table of FIG. 11.

If an oscillator producing square waves is employed as the voltage controlled oscillator 11, the harmonic generator 12 may be dispensed with since sufficiently high harmonics may be obtained.

The r-f amplifiers 13 and 14 are provided for switching in order to prevent malfunctioning that might result due to radiated waves at the time of detecting the 59-MHz frequency; the r-f amplifier is effective in eliminating malfunctioning due to spurious components other than the frequencies shown in FIG. 3.

The frequency of 59 MHz can be detected by the filter 18 only when there holds a relation $$| mf_{11} - nf_{15} | = 59 \text{ (MHz)},$$

where $f_{11}$ is the oscillation frequency of the voltage controlled oscillator 11, $f_{15}$ is the oscillation frequency of the oscillator 15, and $m$ and $n$ are arbitrary integers. In most cases, the amplitude of the component of this frequency is of the negligible order and leads to no particular problem. Problems, however, would arise when the oscillation frequency $f_{15}$ of the oscillator 15 reaches frequencies in the plots 109, 110 and 111 in FIG. 3 in case when the frequency sweeping is started from a frequency in the plot 107. The amplitude of the 59 MHz component in the output of the mixer 16 is desired to be sufficiently large only when there hold a relation $$f_{15} - 3f_{11} = 59 \text{ (MHz)}$$

and this relation is provided as the output of the voltage controlled oscillator 11 is coupled to the r-f amplifier 13 for amplification. Accordingly, power supply to the voltage controlled oscillator 11 is cut by the switch 30 to render the oscillator 11 inoperative after the selected station has been tuned in order to prevent undesired noise from appearing in the reproduced picture.

The digital-to-analog converter 24 in this embodiment need only to provide analog output which simply increases stepwise in accordance with the count of the counter 23, so that it may have a very simple construction. Also, the counter 23 may be constructed by merely connecting several flip-flops in cascade, and tuning with sufficient precision may be obtained only with about 12 bits.

As has been described, with the tuner of the above construction it is possible to select television stations digitally and entirely electronically, so that the tuning operation is very much simplified. Also, since the tuning is done randomly, the time required for it is extremely reduced. Further, because of the digital operation it is possible to indicate the channel number or channel frequency of the selected stations. Furthermore, it is very easy to digitally supply the channel number or frequency thereof to be tuned in from a separate system, which means that remote control fuction can be readily provided.

Figure 6:
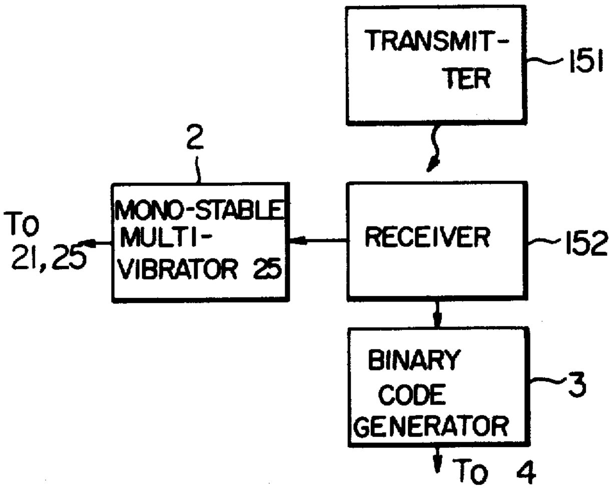
FIG. 6 is a block diagram showing part of another embodiment.

For example, the keyboard 1 in the above embodiment may be replaced with a transmitter 151 transmitting encoded channel information and a receiver 152 to receive the transmitted signal from the transmitter and produce corresponding signals to be coupled to monostable multivibrator 2 and binary code generator 3 as shown in FIG. 6. With this means remote control can be obtained.

Figure 7:
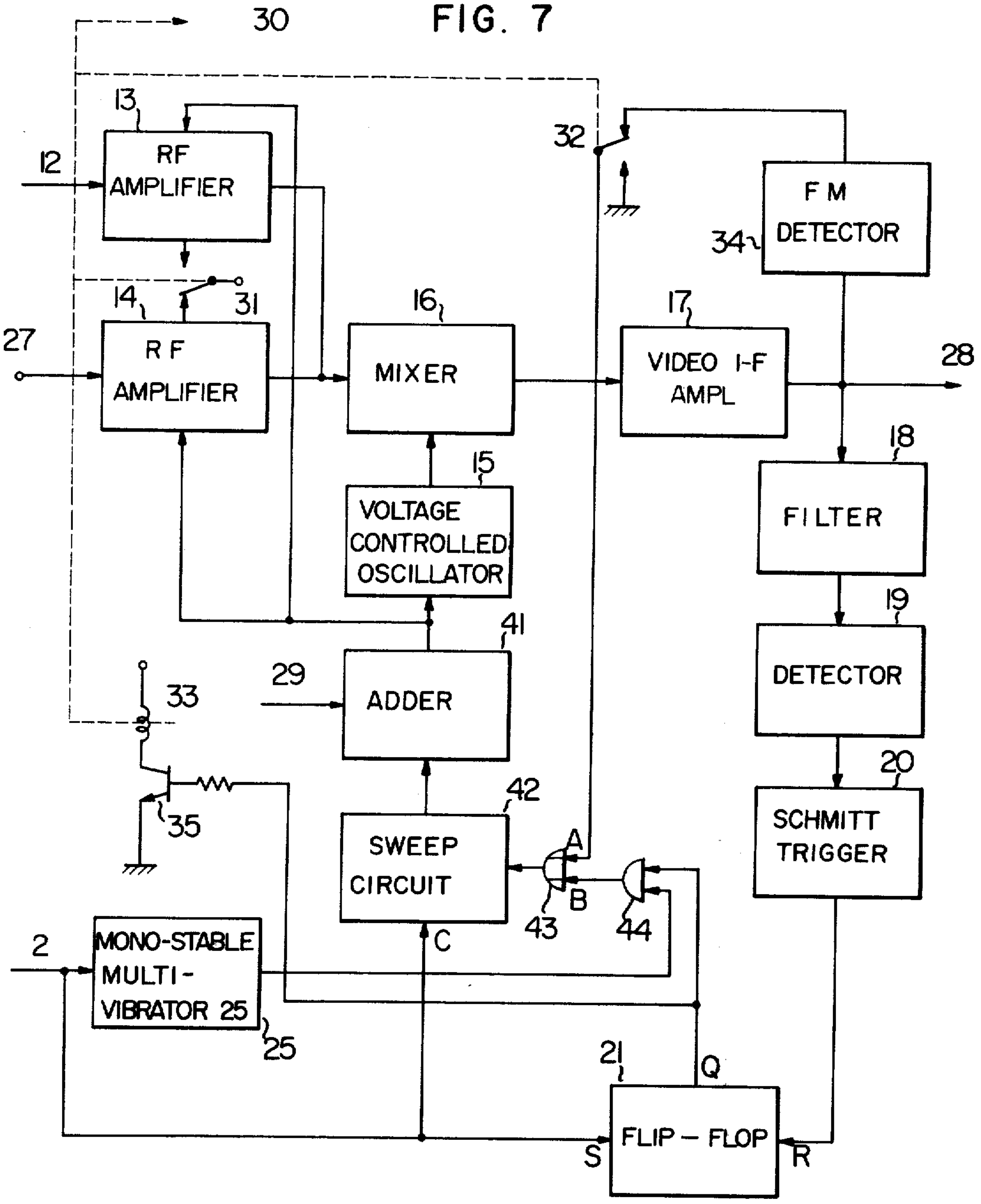
FIG. 7 is a block diagram showing part of a further embodiment of the automatic tuner.

FIG. 7 shows another embodiment, which is similar to the preceding embodiment of FIG. 1 except for a portion enclosed within broken line loop in FIG. 1. While in the FIG. 1 embodiment the frequency sweeping has been done digitally with gated oscillator 22, counter 23 and digital-to-analog converter 24, in the embodiment of FIG. 7 it is done analog-wise as will be described hereinafter.

Figure 8:
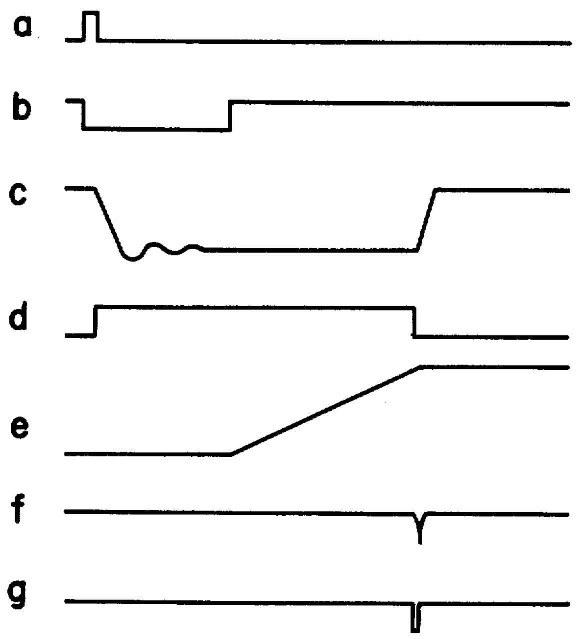
FIG. 8 is a waveform chart showing waveforms appearing at various parts of the embodiment of FIG. 7.

When channel information for a desired station is keyed in keyboard 1, monostable multivibrator 2 produces a pulse as shown at A in FIG. 8. By this pulse, flip-flop 21 is set as shown at D in FIG. 8. Also, monostable multivibrator 25 is triggered and rendered into a quasi-stable state as shown at B in FIG. 8. Simultaneously, a voltage sweep circuit 42 is reset, with its output reduced to zero. While the monostable multivibrator 25 is in the quasi-stable state, transistor 35 is triggered by the output of flip-flop 21 to activate relay coil 33, thus connecting a power supply through relay contact 30 to voltage controlled oscillator 11 to render the phase locked loop operative and also through relay contact 32 to the earth side and relay contact 31 to the side of r-f amplifier 13 to render r-f amplifier 13 operative and r-f amplifier 14 inoperative. The frequency control voltage coupled to voltage controlled oscillator 11 varies in a manner as shown at C in FIG. 8. It varies in accordance with the output frequency of voltage controlled oscillator 11, and it settles to a certain constant value while monostable multivibrator 25 is still in the quasi-stable state.

When monostable multivibrator 25 returns to its initial stable state, the outputs of AND circuit 44 and OR circuit 43 are rendered into high potential state, whereupon voltage sweeping in the voltage sweep circuit 42 is started. The output of r-f amplifier 13 and the output of voltage controlled oscillator 15 are combined in mixer 16, whose output is amplified in video i-f amplifier 17 to obtain video i-f signal available at terminal 28. This video i-f signal is coupled through filter 18 and envelope detector 19 to obtain a surge voltage as shown at f in FIG. 8, which voltage is shaped in shaper 20 into a pulse as shown at g in FIG. 8. This pulse is produced when the difference between the output frequencies of r-f amplifier 13 and voltage controlled oscillator 15 reaches 59 MHz, and it resets flip-flop 21. At this instant, the Q output of flip-flop 21 falls back to the initial low potential state as shown at D in FIG. 8, whereupon the sweeping in the sweep circuit 42 ceases, so that the voltage controlled oscillator 15 continues oscillation at the frequency at this instant. Also, at this instant the transistor 35 is cut off to de-energize the relay coil 33, thus cutting power supply to the voltage controlled oscillator 11 so that the oscillation frequency control voltage thereto changes in a manner as shown at C in FIG. 8. Simultaneously, the switch 31 switches power supply from r-f amplifier 13 to r-f amplifier 14 to render r-f amplifier 13 inoperative and r-f amplifier 14 operative. Further, the switch 32 is thrown back to the side of FM detector 34, so that the output thereof is coupled through the OR circuit 43 to the sweep circuit 42 to provide for the control of the oscillation frequency of the voltage controlled oscillator 15 such that the output of the video i-f amplifier is maintained at 58.75 MHz to ensure optimum tuning at all time.

Figure 9:
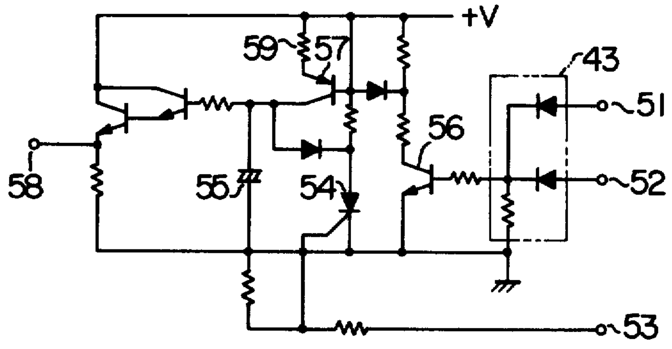
FIG. 9 is a circuit diagram showing a sweep circuit.

FIG. 9 shows the detailed circuit construction of the sweep circuit 42 in the above embodiment of FIG. 7. Numeral 51 designates an OR gate input terminal connected through the switch 32 to the FM detector 34, and numeral 52 designates another OR gate input terminal connected to the AND circuit 44. When channel information is keyed in the keyboard 1, a thyristor 54 is triggered by a reset pulse appearing at a terminal 53 to cause discharging of a capacitor 55, so that the potential on an output terminal 58 connected to a Darlington circuit is reduced to zero. When the Q output of the flip-flop 21 is turned to the high potential state, a transistor 57 is triggered, so that the capacitor 55 is charged through resistor 59 and transistor 57. As the terminal voltage across the capacitor 55 progressively builds up, a corresponding sweep voltage waveform is obtained from the output terminal 58. During this period, the terminal 51 is connected through the switch 32 to earth, so that it is held at zero potential. Upon subsequent appearance of an output pulse from Schmitt trigger shaper 20 to reset the flip-flop 21, the Q output thereof is reduced to zero to reduce the potential on the terminal 52 to zero. At this instant, however, the switch 32 is thrown to the side of the FM detector 34, whereby the output voltage thereof appears at the terminal 51. The FM detector 34 has a characteristic as shown in FIG. 5 as has been mentioned earlier, so that the potential on the terminal 51 is zero when exact tuning condition prevails with i-f frequency at 58.75 MHz.. When this state is brought about, the output of the OR circuit 43 is reduced to zero to cut off the transistors 56 and 57. Thus, the capacitor 55 is no longer charged, bringing an end to the sweeping of the voltage on the output terminal 58, so that the tuner can maintain the optimum tuning condition. As the capacitor 55 is subsequently discharged gradually, the potential on the terminal 58 is also reduced gradually. With deviation from the optimum tning condition, the potential on the terminal 51 is gradually increased according to the characteristic of FIG. 5 until the transistor 56 is triggered again, whereupon the base potential on the transistor 57 is reduced so that this transistor is also triggered to cause charging of the capacitor 55. In this way, the potential on the output terminal 58 is again increased, and as the potential on the terminal 51 again becomes nearly zero the transistor 56 is cut off, thus again bringing an end to the voltage sweeping at the terminal 58. In the above way, the terminal 58 can always be maintained at an optimum tuning potential by virtue of the characteristic of the FM detector as shown in FIG. 5.

Figure 10:
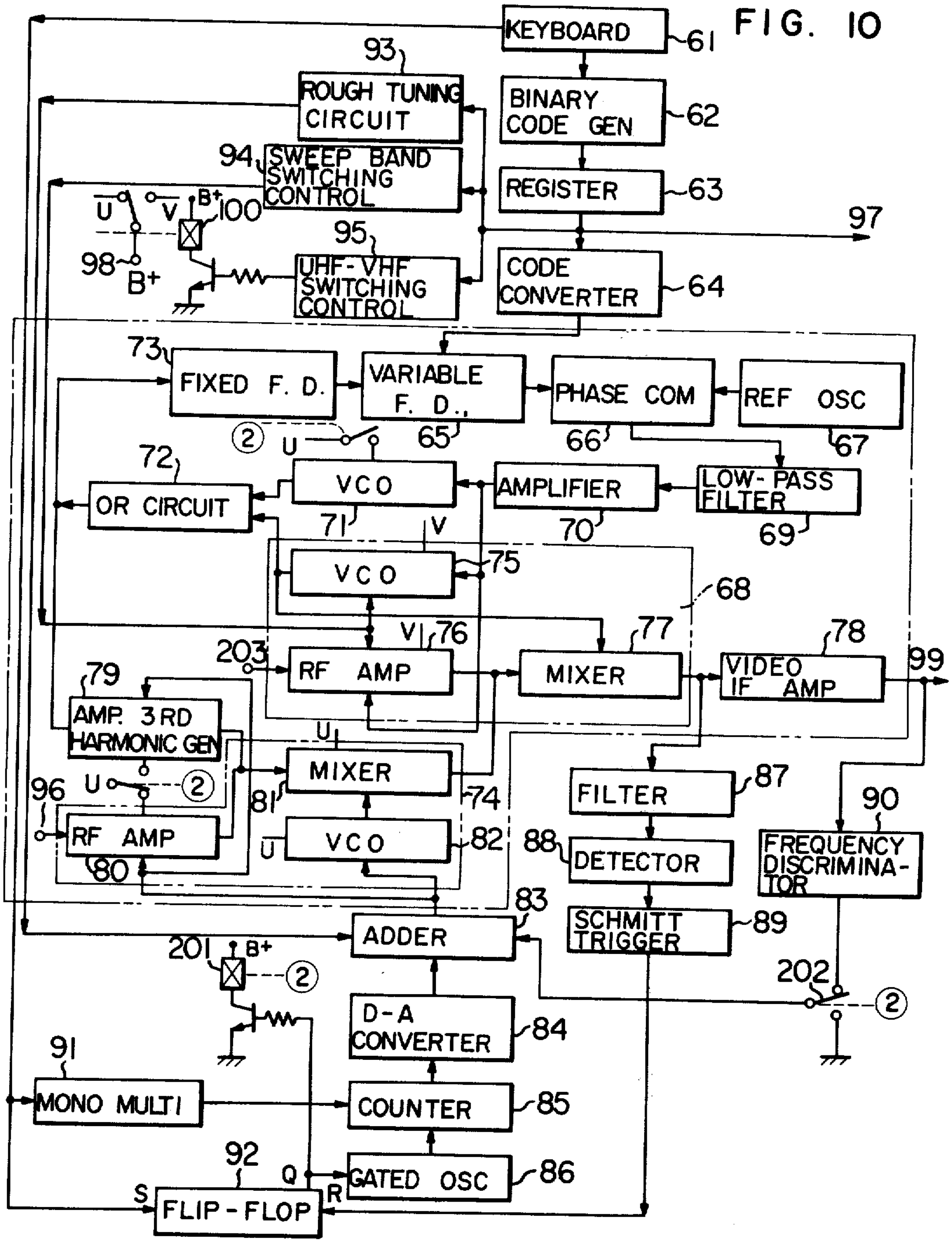
FIG. 10 is a block diagram showing a still another embodiment of the automatic tuner.

FIG. 10 shows still another embodiment of the automatic tuner capable of reception of UHF as well as VHF channels according to the invention. Reference numeral 61 designates a keyboard for selecting desired stations to be tuned in, numeral 62 a binary code generator to convert the channel information from the keyboard 61 into a corresponding binary code, and numeral 63 a register. Numeral 64 designates a code converter to convert the code output of the register 63 into a code to be described hereinafter. Numeral 65 designates a variable frequency divider whose frequency division ratio is controlled by the output code of the code converter 64, numeral 67 a reference frequency oscillator providing a reference signal at a constant frequency, numeral 66 a phase comparator to compare the phases of the outputs of variable frequency divider and reference frequency oscillator, numeral 69 a low-pass filter, and numeral 70 a d-c amplifier. Numerals 71 and 75 designate voltage controlled oscillators (VCO) whose output frequency changes according to their input voltage, numeral 72 an OR circuit to take the sum of the outputs of the voltage controlled oscillators 71 and 75, and numeral 73 a fixed frequency divider to preliminarily frequency divide the output of the OR circuit 72 into a frequency within the input frequency range covered by the variable frequency divider 65. Numeral 68 generally designates an electronic tuner section comprising an r-f amplifier 76, mixer 77 and voltage controlled oscillator 75 serving as local oscillator. Numeral 203 designates a terminal connected to a VHF antenna input circuit, numeral 78 a video i-f amplifier, and numeral 99 an output terminal. Numeral 95 designates a UHF-VHF switching control circuit to control the switching of a power supply terminal 98 between U and V terminals by operating a relay 100 in accordance with the output code of the register 63.

With the elements described so far of this embodiment, VHF channels can be received. When a desired VHF is selected by the keyboard 61, the U-V switching control circuit 95 activates the relay 100 in response to the output of the register 63 such as to connect power supply to the V terminal. Thus, power supply is disconnected from VCO 71 and connected to VCO 75 and r-f amplifier 76. The mixer 77 is furnished with power at any time of receiving a UHF or VHF channel. The fixed frequency divider 73, variable frequency divider 65, phase comparator 66, reference frequency oscillator 67, filter 69, d-c amplifier 70, VCO 75 and OR circuit 72 constitute a phase locked loop. Denoting the frequency division ratio of the variable frequency divider 65 by P, oscillation frequency of VCO 75 by $f_{75}$, frequency division ratio of the fixed frequency divider 73 by $m$ and oscillation frequency of the reference frequency oscillator 67 by $f_0$, there holds a relation $$f_{75} = mpf_0$$

Assuming the denomination in $m$ and $f_0$ to be fixed, $f_{75}$ may be varied by varying P. The output of the d-c amplifier 70 also constitutes the tuning voltage for the r-f amplifier 76. To receive a broadcast wave with a carrier frequency of, for instance, 193.25 MHz, the local oscillator frequency should be 193.25 MHz + 58.75 MHz = 252 MHz with respect to the intermediate frequency of 58.75 MHz. With $m = 200$ and $f_0 = 5$ kHz, we may set $P = 252$ in this case. Specific values of various frequencies and P for tuning in VHF channels in this example are shown in the VHF section in the table of FIG. 12. The code converter 64 accordingly converts the code (for instance BCD code) memorized in the register 63 into a code for controlling the frequency division ratio of the various frequency divider 65 such that the corresponding channel may be tuned in. The fixed frequency divider 73 is provided because the upper limit of the input frequency range covered by the variable frequency divider 65 is not so high so that it is necessary to frequency divide the output of the OR circuit 72 into a frequency within the afore-mentioned range. With this measure, however, the receivable frequency range which depends upon the input frequency coverage of the fixed frequency divider 73, is only as wide as the VHF band at most. If UHF channels were to be received in the same way, the fixed frequency divider 73 should have a very expensive construction, which would lead to various problems in practice.

In the instant embodiment, the above drawback is overcome for a UHF channel selecting means is provided separately from the VHF channel selecting means. For the reception of UHF channels, additional parts which have not yet been described are necessary and will now be described. Numeral 79 designates an amplifier or harmonic generator to amplify the third harmonic of the fundamental frequency of the output of the OR circuit 72. Numeral 96 designates a terminal connected to a UHF antenna input circuit, and numeral 74 generally designates a UHF tuner section comprising an r-f amplifier 80 to selectively amplify the antenna input, a local oscillator (VCO) 82 and a mixer 81. Numeral 86 designates a gated oscillator whose oscillation is on-off controlled according to the state of a flip-flop 92, numeral 85 a counter, numeral 84 a digital-to-analog converter to convert the content of the counter 85 into a corresponding analog value coupled through an adder 83 to the VCO 82 as the oscillation frequency control voltage. Numeral 87 designates a filter consisting of a crystal element or the like and having an exceedingly narrow pass band with a center frequency of 59 MHz, numeral 88 an envelope detector to rectify the filter output and take out the envelope thereof, and numeral 89 a Schmitt trigger or voltage comparator circuit to convert the output of the detector 88 into a rectangular wave at a suitable threshold level. Numeral 78 designates a video i-f amplifier, and numeral 90 a frequency discriminator having an output voltage versus input frequency characteristic as shown in FIG. 5. Numeral 93 designates a rough tuning circuit to produce a rough tuning voltage substantially equal to the tuning voltage for a channel corresponding to the output code of the register 63 (but slightly lower than the actual tuning voltage). Numeral 94 designates a sweep band switching control circuit to provide a voltage for switching sweep bands. This circuit is provided because the entire VHF band cannot be covered solely by the tuning voltage coupled to the variable capacitance diode since Channel No. 3 and Channel No. 4, for instance, are spaced too far from each other, so that it is necessary to switch sweep bands by switching inductances constituting component parts of the oscillator. Numeral 91 designates a monostable multivibrator to produce a pulse every time a station to be tuned in is selected by the keyboard.

The operation of this embodiment in tuning in UHF channels will now be described. When channel information for a desired UHF channel is keyed in the keyboard 61, the monostable multivibrator 91 is rendered into a quasi-stable state, and the flip-flop 92 is simultaneously set. Upon setting of the flip-flop 92 the Q output thereof turns to a high potential state, whereupon the oscillation of the gated oscillator 86 is started. During the quasi-stable state of the monostable multivibrator 91, however, the counter 85 is held reset so that the output of the oscillator 86 is not counted. Thus, during this period the digital-to-analog converter 84 provides zero output. Meanwhile, the UHF-VHF switching control circuit 95 acts under the command of the output code of the register 63 to activate the relay 100 so as to connect the power supply terminal 98 to the U terminal. Thus, during the set state of the flip-flop 92 the VCO 71 is held operative by a relay 202. During the quasi-stable state of the monostable multivibrator 91 the oscillation frequency of the VCO 71 settles to a certain preset frequency, and upon returning of the multivibrator to its initial stable state the counter 85 starts counting, and its digital count is converted through the digital-to-analog converter 84 to an analog voltage, which is coupled through the adder 83 to the VCO 82 for frequency sweeping therein. During the set state of the flip-flop 92, the amplifier 79 is also held operative by the relay 201, and a relay contact 202 is held thrown to the earth side. Thus, during this period the amplifier amplifies the third harmonic component of the output of the VCO 71, and the output of the amplifier 79 is beated with the output of the VCO 82 in the mixer 81, with the output of the mixer 81 being amplified through the VHF tuner amplifier 77. The mixer 77 serves as a mixer to combine the outputs of VCO 75 and r-f amplifier 76 when receiving a VHF signal, while it acts as an amplifier when receiving a UHF signal. The output of the mixer 77 is coupled through the circuits 87, 88 and 89, and at the instant when it comes up with a 59 MHz component the circuit 89 produces a pulse to reset the flip-flop 92. Upon resetting of the flip-flop 92 the relay 202 cuts power supply to the amplifier 79 and VCO 71 and connects power supply to the amplifier 80, while the relay contact 202 is simultaneously thrown back to the output side of the frequency discriminator 90. As a result, the oscillation of the gated oscillator 86 is stopped to bring an end to the sweeping in the VCO 82, so that the reception state sets in. The operation described above is similar to that of the embodiment of FIG. 1.

While in the preceding embodiment role of the VCO in the phase lock has been played by the VCO 71 when receiving a UHF channel and by the VCO 75 when receiving a VHF channel, similar operation may be obtained by having a single or common VCO and providing a separate amplifier amplifying the output of the mixer 81 to provide an output for addition to the output of the mixer 77. Also, the digital-to-analog converter 84 need only to provide analog output which simply increases stepwise with the count of the counter 85, so that it may have a very simple construction. Further, the counter 85 may be constructed by merely connecting several flip-flops in cascade, and tuning with sufficient precision may be obtained only with about 12 bits.

Figures 13A, 13B:
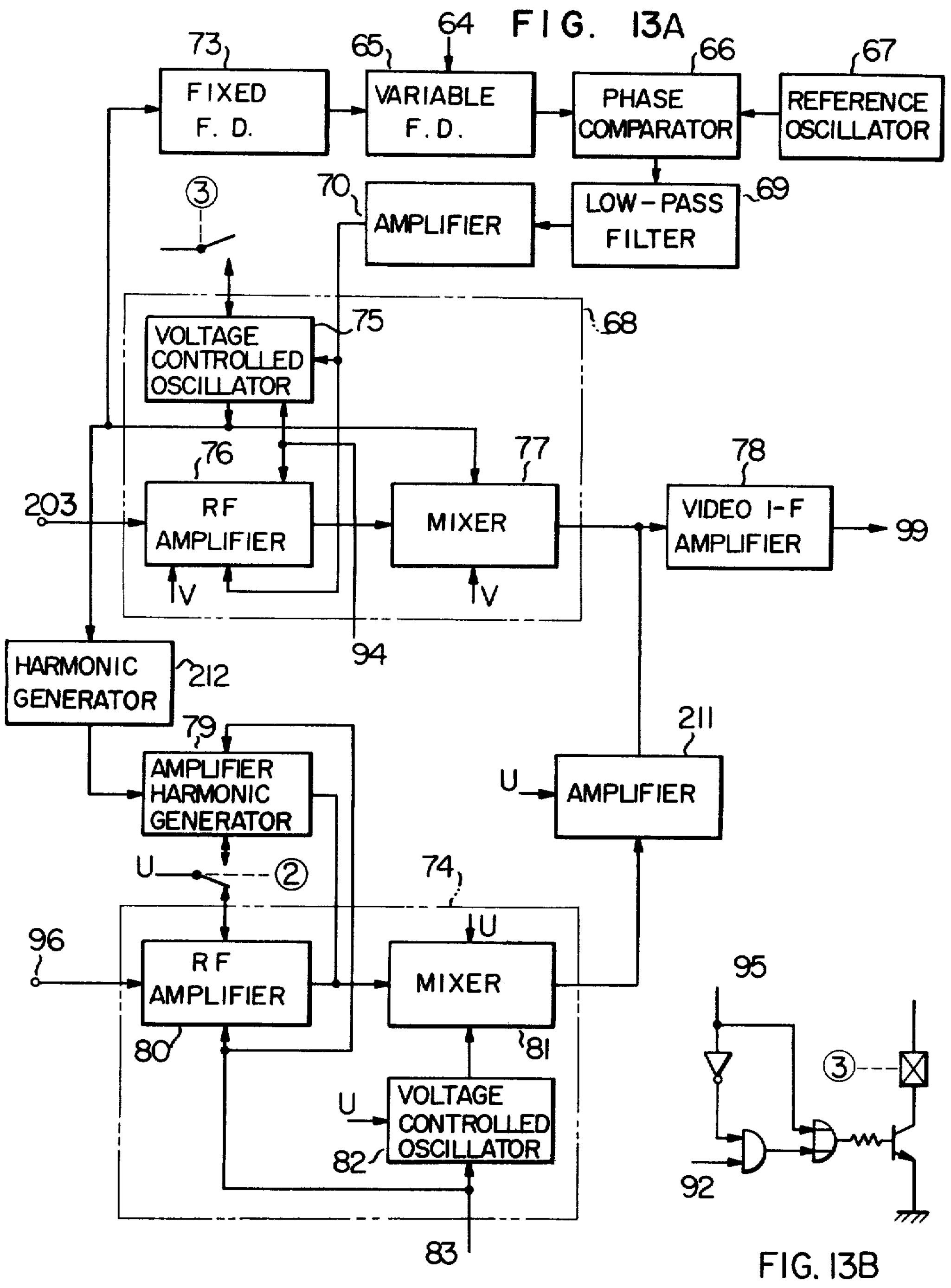
FIGS. 13A and 13B are block diagrams showing a still further embodiment of the automatic tuner.

FIGS. 13A and 13B a still further embodiment, which is similar to the preceding embodiment of FIG. 10 except for that a common VCO is used in the phase locked loop. More particularly, while in the preceding embodiment the role of the VCO in the phase locked loop is served by the VCO 71 when tuning in a UHF channel and by the VCO 75 when tuning in a VHF channel, in this embodiment the same VCO is used for either UHF or VHF channel. Referring to FIG. 13, numeral 211 designates an amplifier, and numeral 212 a harmonic generator having a circuit construction, for instance, as shown in FIG. 4. In the preceding embodiment the local oscillator in the VHF tuner cannot be commonly used for UHF and VHF channel because the VHF tuner mixer is used as an amplifier when receiving a UHF channel, but in this embodiment it can be commonly used for both UHF and VHF channels.

What we claim is:

1. Automatic tuning apparatus, comprising:

means for selecting a desired channel to be tuned and for generating an output signal corresponding to said desired channel;

first oscillator means for generating a local oscillation signal having a frequency corresponding to said desired channel to be tuned, including:

a variable frequency divider coupled to the output of said channel selecting means and having a frequency division ratio which varies according to the output of said channel selecting means, a reference frequency oscillator for generating a reference frequency signal, means coupled to said variable frequency divider and to said reference frequency oscillator for comparing the phase of said reference frequency signal with that of the output signal of said variable frequency divider and for generating an output signal corresponding to the phase difference between said reference frequency and variable divider signals, first and second voltage control oscillators coupled to the output of said phase comparison means, the oscillation frequencies of said voltage controlled oscillators being controlled by the output of said phase comparison means, said first and second voltage controlled oscillators producing different oscillation frequencies relative to each other, means for generating an $n$-th harmonic wave ($n$ being a natural number not less than 2) coupled to the output of said first voltage controlled oscillator, second oscillator means for generating a swept frequency output signal, first means for mixing the output of said harmonic wave generating means with the output of said swept frequency oscillator means to produce a beat frequency output signal, detecting means for detecting said beat frequency signal produced by said first mixing means and for generating an output control signal when said beat signal reaches a predetermined frequency, stop and hold means coupling the output of said detecting means to said swept frequency oscillator means to stop the frequency sweeping action thereof when said detecting means generates said output control signal and to hold said swept frequency oscillator means locked to its last generated output frequency, second means for mixing the output of said swept frequency oscillator means with an antenna input signal having a first frequency band to produce a first intermediate frequency signal, third means for mixing the output of said second voltage controlled oscillator with an antenna input signal having a second frequency band different from said first frequency band to produce a second intermediate frequency signal, first switching means coupled to said detecting means for switching between said first and second mixing means as a function of the output signal generated by said detecting means, and second switching means coupled to said channel selecting means for switching between said second and third mixing means as a function of the output signal from said channel selecting means.

2. The automatic tuner according to claim 1, wherein said first and second voltage controlled oscillators comprise a common oscillator means, UHF television channel intermediate frequency signals being taken out from said second mixer means and VHF television channel intermediate frequency signals being taken out from said third mixer means.

3. Automatic tuning apparatus, comprising:

means for selecting a desired channel to be tuned and for generating an output signal corresponding to said desired channel;

first oscillating means generating a local oscillation signal having a frequency corresponding to said desired channel to be tuned, including:

a variable frequency divider coupled to the output of said channel selecting means and having a frequency division ratio which varies according to the output of said channel selecting means, a reference frequency oscillator for generating a reference frequency signal, means coupled to said variable frequency divider and to said reference frequency oscillator for comparing the phase of said reference frequency signal with the phase of the output signal of said variable frequency divider and for generating an output signal corresponding to the phase difference between said reference frequency and variable divider signals, and a voltage controlled oscillator having an input coupled to the output of said phase comparison means and an output coupled to an input of said variable frequency divider, the oscillation frequency of said voltage controlled oscillator being controlled by the output of said phase comparison means, second oscillator means for generating a swept frequency output signal, first means for mixing the output of said first oscillator means with the output of said second oscillator means to produce a beat frequency output signal, detecting means for detecting said beat frequency signal produced by said first mixing means and for generating an output control signal when said beat signal reaches a predetermined frequency, stop and hold means coupled between the output of said detecting means and said second oscillator means to stop the frequency sweeping action thereof when said detecting means generates said output control signal and to hold said second oscillator means locked to its last generated output frequency, second means for mixing the output of said second oscillator means with an antenna input signal to produce an intermediate frequency signal, and means coupled to said detecting means for switching between said first and second mixing means as a function of the output signal generated by said detecting means.

4. The automatic tuner according to claim 3, wherein said channel selecting means comprises a keyboard.

5. The automatic tuner according to claim 3, wherein said channel selecting means comprises a remote control transmitter to transmit coded information and receiving means to receive information transmitted from said transmitter to control said first oscillating means.

6. The automatic tuner according to claim 3, which further comprises means to receive the output of said voltage controlled oscillator and produce a harmonic wave and means to amplify said harmonic wave for coupling to said first mixer means.

7. The automatic tuner according to claim 3, wherein said second oscillating means includes a sweep voltage generator to produce a sweep voltage varying with time, and a second voltage controlled oscillator coupled to the output of said sweep voltage generator.

8. The automatic tuner according to claim 7, wherein said stop and hold means includes means to frequency discriminate said intermediate frequency signal and means to produce the sum of the output voltage of said frequency discriminating means and the output voltage of said sweep voltage generator in the hold state of said second oscillating means, said sum of voltages being coupled to said second voltage controlled oscillator.

9. The automatic tuner according to claim 7, wherein said sweep voltage generator includes a gated oscillator, a counter to count the output of said gated oscillator, and a digital-to-analog converter to convert the output of said counter into an analog voltage, said analog voltage being applied to said second voltage controlled oscillator as the sweep voltage.

10. The automatic tuner according to claim 7, wherein said sweep voltage generator includes a circuit to produce a constant output voltage during the period between the generation of said channel selection signal and the generation of said detecting means output control signal, a capacitor and means to charge said capacitor by said constant output voltage, the terminal voltage across said capacitor being applied to said second voltage controlled oscillator as the sweep voltage.

11. The automatic tuner according to claim 7, further comprising means to add together the output of said channel selecting means and the output of said sweep voltage generating means, the output of said adding means being coupled to said voltage controlled oscillator, thereby reducing the sweeping period.

* * * * *